(12) United States Patent
Lee

(10) Patent No.: US 11,302,265 B2
(45) Date of Patent: Apr. 12, 2022

(54) ORGANIC LIGHT EMITTING DIODE DISPLAY

(71) Applicant: Samsung Display Co., LTD., Yongin-si (KR)

(72) Inventor: Kye-Uk Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 3 days.

(21) Appl. No.: 16/737,709

(22) Filed: Jan. 8, 2020

(65) Prior Publication Data
US 2020/0226983 A1 Jul. 16, 2020

(30) Foreign Application Priority Data
Jan. 11, 2019 (KR) .................. 10-2019-0004166

(51) Int. Cl.
*G09G 3/3225* (2016.01)
*G09G 3/3291* (2016.01)
*H01L 27/32* (2006.01)

(52) U.S. Cl.
CPC ......... *G09G 3/3291* (2013.01); *G09G 3/3225* (2013.01); *H01L 27/3262* (2013.01); *H01L 27/3276* (2013.01)

(58) Field of Classification Search
CPC ... G09G 2300/0426; G09G 2320/0295; G09G 3/3225; G09G 3/3233; G09G 3/3291; H01L 27/3262; H01L 27/3276
See application file for complete search history.

(56) References Cited

U.S. PATENT DOCUMENTS

| 9,466,810 | B2 | 10/2016 | Lee et al. | |
|---|---|---|---|---|
| 2005/0104817 | A1* | 5/2005 | Kwak | G09G 3/2022 345/76 |
| 2010/0079419 | A1* | 4/2010 | Shibusawa | H01L 27/3272 345/204 |
| 2011/0134045 | A1* | 6/2011 | Chan | H01L 27/1281 345/168 |

(Continued)

FOREIGN PATENT DOCUMENTS

| KR | 1020150009126 | 1/2015 |
|---|---|---|
| KR | 1020160015060 | 2/2016 |
| KR | 1020160047133 | 5/2016 |

*Primary Examiner* — Ram A Mistry
(74) *Attorney, Agent, or Firm* — Cantor Colburn LLP

(57) ABSTRACT

An organic light emitting diode display includes pixel groups disposed in parallel in a first direction and each including n1 pixel regions; driving voltage lines disposed between two adjacent pixel regions of the n1 pixel regions and extending in a second direction intersecting the first direction to apply a driving voltage to the two adjacent pixel regions; initializing voltage lines extending in the second direction to apply an initializing voltage to the pixel groups; data lines extending in the second direction to apply a data voltage to the pixel groups; first driving low-voltage lines extending in the second direction to apply a driving low voltage to the pixel groups; and a scan line extending in the first direction and intersecting the driving voltage lines, the initializing voltage lines, the data lines and the first driving low-voltage lines, where 3×n2 pixel groups are disposed between two adjacent first driving low-voltage lines.

20 Claims, 9 Drawing Sheets

(56) References Cited

U.S. PATENT DOCUMENTS

| | | | |
|---|---|---|---|
| 2011/0175846 A1* | 7/2011 | Wang | G06F 3/0412 |
| | | | 345/174 |
| 2013/0147690 A1* | 6/2013 | Kim | G09G 3/3233 |
| | | | 345/76 |
| 2016/0064465 A1* | 3/2016 | Oh | H01L 27/1251 |
| | | | 257/43 |

* cited by examiner

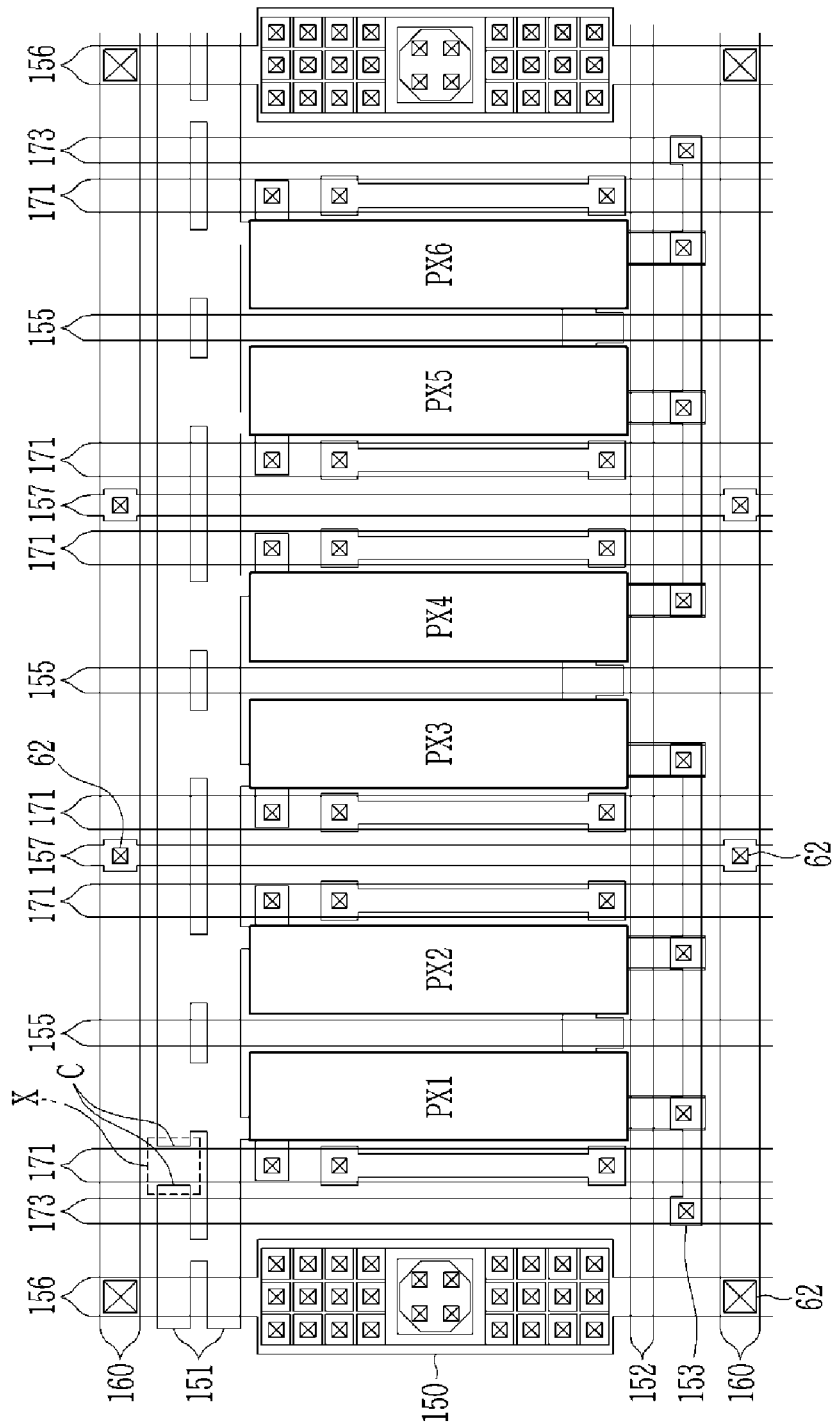

ORGANIC LIGHT EMITTING DIODE DISPLAY

This application claims priority to Korean Patent Application No. 10-2019-0004166, filed on Jan. 11, 2019, and all the benefits accruing therefrom under 35 U.S.C. § 119, the content of which in its entirety is herein incorporated by reference.

BACKGROUND

(a) Field

The disclosure relates to an organic light emitting diode display, and more particularly, to a high resolution organic light emitting diode display.

(b) Description of the Related Art

Recently, an organic light emitting diode display has attracted attention as a device for displaying an image.

Since the organic light emitting diode display has a self-emission characteristic without an additional light source, unlike a liquid crystal display, such that thickness and weight thereof may be reduced. Further, the organic light emitting diode display has high-quality characteristics such as low power consumption, high luminance, and high response speed.

The organic light emitting diode display has a complicated pixel structure as compared with the liquid crystal display, thus a space for forming pixels may not be effectively secured as a resolution thereof increases.

SUMMARY

Exemplary embodiments of the invention relate to an organic light emitting diode display in which high resolution may be realized without increasing an opening for connecting a driving low-voltage line and a cathode electrode, and a width of a gate or data wire may be increased.

An exemplary embodiment of the invention provides an organic light emitting diode display, including: a plurality of pixel groups disposed in parallel in a first direction, wherein each of the plurality of pixel groups includes n1 pixel regions, and n1 is a natural number; a plurality of driving voltage lines disposed between two adjacent pixel regions of the n1 pixel regions and extending in a second direction intersecting the first direction to apply a driving voltage to the two adjacent pixel regions; a plurality of initializing voltage lines extending in the second direction to apply an initializing voltage to the plurality of pixel groups; a plurality of data lines extending in the second direction to apply a data voltage to the plurality of pixel groups; a plurality of first driving low-voltage lines extending in the second direction to apply a driving low voltage to the plurality of pixel groups; and a scan line extending in the first direction and intersecting the plurality of driving voltage lines, the plurality of initializing voltage lines, the plurality of data lines, and the plurality of first driving low-voltage lines, where 3×n2 pixel groups among the plurality of pixel groups are disposed between two adjacent first driving low-voltage lines of the plurality of first driving low-voltage lines, and n2 is a natural number.

In an exemplary embodiment, the organic light emitting diode display may further include a plurality of second driving low-voltage lines extending in the second direction to apply the driving low voltage to the plurality of pixel groups, where a single pixel group of the plurality of pixel groups may be disposed between two adjacent second driving low-voltage lines of the plurality of second driving low-voltage lines.

In an exemplary embodiment, the single pixel group of the plurality of pixel groups may be disposed between two adjacent data lines of the plurality of data lines, and the 3×n pixel groups may be disposed between two adjacent initializing voltage lines of the plurality of initializing voltage lines.

In an exemplary embodiment, three pixel groups of the plurality of pixel groups may be disposed between the two adjacent first driving low-voltage lines.

In an exemplary embodiment, the organic light emitting diode display may further include a driving low voltage transmitting line extending in the first direction, wherein the plurality of first driving low-voltage lines and the plurality of second driving low-voltage lines may be electrically connected to the driving low voltage transmitting line.

In an exemplary embodiment, a plurality of openings may be defined to overlap the plurality of first driving low-voltage lines.

In an exemplary embodiment, the organic light emitting diode display may further include a cathode electrode electrically connected to the plurality of first driving low-voltage lines through the plurality of openings.

In an exemplary embodiment, the scan line may include two wires extending in the first direction and a bridge connecting the two wires to each other.

In an exemplary embodiment, the scan line may include a cut region in a portion where the two wires except for the bridge intersect one of the plurality of data lines.

In an exemplary embodiment, the plurality of pixel groups may include a pixel region including a thin film transistor, an anode electrode connected to the thin film transistor, and an organic light emitting layer disposed on the anode electrode.

Another exemplary embodiment of the invention provides an organic light emitting diode display, including: a plurality of pixel groups disposed in parallel in a first direction, wherein each of the plurality of pixel groups includes n1 pixel regions and n1 is a natural number; a plurality of driving voltage lines disposed between two adjacent pixel regions of the n1 pixel regions and extending in a second direction intersecting the first direction to apply a driving voltage to the two adjacent pixel regions; a plurality of initializing voltage lines extending in the second direction to apply an initializing voltage to the plurality of pixel groups; a plurality of data lines extending in the second direction to apply a data voltage to the plurality of pixel groups; and a scan line including two wires extending in the first direction and a bridge connecting the two wires to each other, where the scan line intersects the plurality of driving voltage lines and the plurality of initializing voltage lines.

In an exemplary embodiment, the organic light emitting diode display may further include a plurality of first driving low-voltage lines extending in the second direction, where 3×n2 pixel groups among the plurality of pixel groups may be disposed between two adjacent first driving low-voltage lines of the plurality of first driving low-voltage lines, and n2 is a natural number.

In an exemplary embodiment, a plurality of openings may be defined to overlap the plurality of first driving low-voltage lines, and the organic light emitting diode display may further include a cathode electrode electrically connected to the plurality of first driving low-voltage lines through the plurality of openings.

In an exemplary embodiment, the organic light emitting diode display may further include a plurality of second driving low-voltage lines extending in the second direction, where a single pixel group of the plurality of pixel groups may be disposed between two adjacent second driving low-voltage lines of the plurality of second driving low-voltage lines.

In an exemplary embodiment, three of the plurality of pixel groups may be disposed between the two adjacent first driving low-voltage lines.

In an exemplary embodiment, the organic light emitting diode display may further include a driving low voltage transmitting line extending in the first direction, where the plurality of first driving low-voltage lines and the plurality of second driving low-voltage lines may be electrically connected to the driving low voltage transmitting line.

Another exemplary embodiment of the invention provides an organic light emitting diode display, including: a substrate; a metal layer disposed on the substrate; a semiconductor layer disposed on the metal layer; a gate insulating layer covering the semiconductor layer; a gate layer including a low-voltage gate connector and disposed on the gate insulating layer; an interlayer insulating layer covering the gate layer; a storage electrode and a data layer disposed on the interlayer insulating layer; and a planarization layer covering the storage electrode and the data layer, wherein the data layer may include a driving voltage line, a first driving low-voltage line, and a second driving low-voltage line, and the first driving low-voltage line may overlap the low-voltage gate connector.

In an exemplary embodiment, the organic light emitting diode display may further include: an anode electrode disposed on the planarization layer; an organic light emitting layer disposed on the anode electrode; and a cathode electrode disposed on the organic light emitting layer.

In an exemplary embodiment, an opening may be defined through the planarization layer to overlap the first driving low-voltage line.

In an exemplary embodiment, the first driving low-voltage line may be electrically connected to the cathode electrode through the opening.

According to exemplary embodiments of the invention, as set forth herein, first driving low-voltage lines, which overlaps openings for connection with a cathode electrode, are disposed at opposite sides of three or more pixel groups, and two pixel regions are disposed to be driven by one driving voltage line, thus high resolution may be realized even in a small pixel space. In such embodiments, by widely forming widths of a gate wire and a data wire in a small pixel space, an RC delay may be reduced for a high resolution driving margin.

In such embodiments, by disposing second driving low-voltage lines having no opening for connection with a cathode electrode at opposite sides of one pixel group, it a voltage drop phenomenon in a pixel region disposed at a distance away from a first driving low-voltage line may be reduced.

BRIEF DESCRIPTION OF THE DRAWINGS

The above and other features of the invention will become more apparent by describing in further detail exemplary embodiments thereof with reference to the accompanying drawings, in which:

FIG. 9 illustrates a plan view of a plurality of pixel regions of an organic light emitting diode display according to an exemplary embodiment, in which a scan line is repaired.

DETAILED DESCRIPTION OF THE EMBODIMENTS

Figure 1:
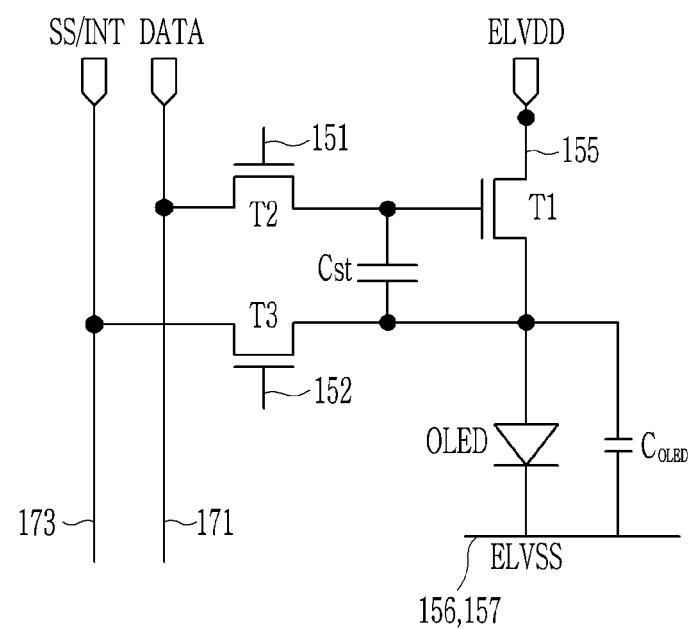
FIG. 1 illustrates an equivalent circuit diagram of one pixel of an organic light emitting diode display according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Further, throughout the specification, the phrase "on a plane" means viewing a target portion from a top plan view or a plan view in a thickness direction, and the phrase "on a cross-section" means viewing a cross-section formed by vertically cutting a target portion from the side.

Hereinafter, exemplary embodiment of the invention the invention will be described in detail with reference to the accompanying drawings.

Exemplary embodiments of an organic light emitting diode display may be characterized by arrangement of a plurality of pixel groups, a driving low-voltage line, and a driving voltage line. Specifically, the first driving low-voltage line is disposed between three or more pixel groups, and the driving voltage line is disposed at a center of two pixel regions.

First, a driving operation of a pixel of an organic light emitting diode display according to an exemplary embodiment will be described with reference to FIG. 1 and FIG. 2, and arrangement characteristics of a first driving low-voltage line, a driving voltage line, and a plurality of pixel groups will be described with reference to FIG. 3 to FIG. 9.

FIG. 1 illustrates an equivalent circuit diagram of a pixel of an organic light emitting diode display according to an exemplary embodiment.

Referring to FIG. 1, an exemplary embodiment of a pixel of the organic light emitting diode display includes a plurality of transistors T1, T2 and T3, a storage capacitor Cst, an additional capacitor $C_{OLED}$, and an organic light emitting diode OLED, which are connected to a plurality of signal lines 151, 152, 171, 173, 155, 156 and 157.

The pixel of the organic light emitting diode display shown in FIG. 1 may be a pixel of an organic light emitting diode display with a high resolution, and each pixel may be controlled by a single data line 171 and a single scan line 151.

First, a structure of one pixel will be described in detail.

The plurality of transistors T1, T2 and T3 included in one pixel includes a first transistor (or a driving transistor) T1, a second transistor (or a switching transistor) T2 connected to the scan line 151, and a third transistor (or an initializing transistor) T3 connected to a previous scan line 152 (hereinafter also referred to as a sensing transistor). The third transistor T3 may be connected to a signal line that applies a gate-on voltage (sensing or initializing voltage SS/INT) at different timing from that of the previous scan line 152.

The scan line 151 is connected to a gate driver (not shown) to transmit a scan signal to the second transistor T2.

The previous scan line 152 is connected to the gate driver, and transmits a previous scan signal applied to a pixel positioned at a previous stage to the third transistor T3.

The data line 171 is a wire for transmitting a data voltage DATA generated in a data driver (not shown), and a single data line 171 is provided for each pixel column. A single data line 171 and a single scan line 151 may select a single pixel to input the data voltage DATA thereto. Luminance of light emitted from the organic light emitting diode OLED (also referred to as an organic light emitting element) varies in accordance with the data voltage DATA applied to the pixel.

A driving voltage line 155 applies a driving voltage ELVDD, and driving low-voltage lines 156 and 157 apply a driving low voltage ELVSS. The driving voltage line 155 and the driving low-voltage lines 156 and 157 may be defined by wires extending in a vertical direction, and the driving low-voltage lines 156 and 157 include a first driving low-voltage line 156 and a second driving low-voltage line 157. Voltages applied to the driving voltage line 155 and the driving low-voltage lines 156 and 157 may each be a constant voltage. The driving voltage ELVDD serves as an input voltage for generating an output current in the driving transistor T1, and when the output current is applied to the organic light emitting diode OLED, the driving low voltage ELVSS is applied to another electrode (hereinafter also referred to as a cathode electrode).

Figure 3:
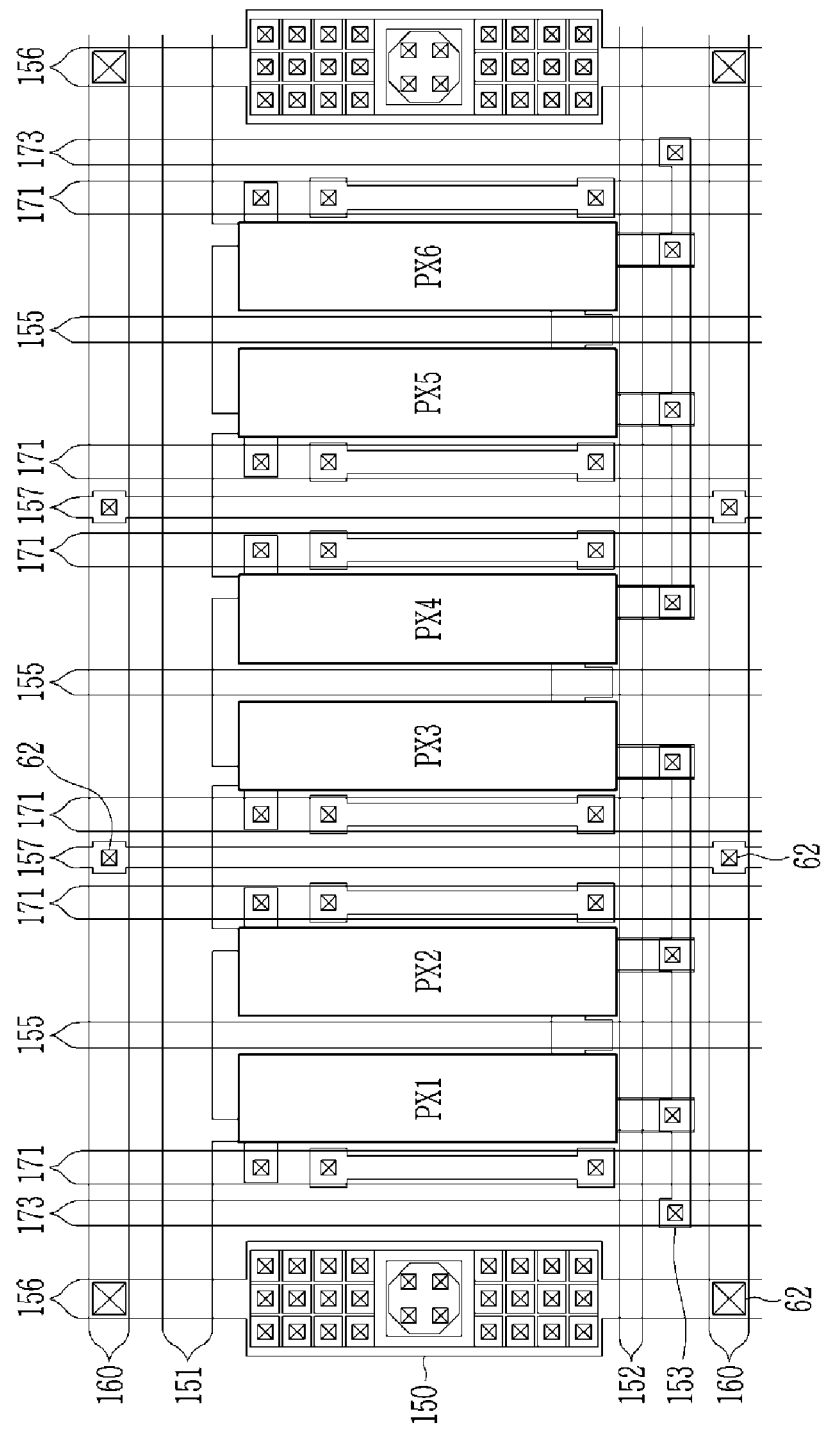
FIG. 3 illustrates a plan view of a plurality of pixels of an organic light emitting diode display according to an exemplary embodiment.

In an exemplary embodiment, the cathode electrode 270 and the first driving low-voltage line 156 are electrically connected to each other through an opening 302 (shown in FIG. 3) defined in a planarization layer 14 (shown in FIGS. 4 and 5) to apply the driving low voltage ELVSS to a cathode electrode 270 (shown in FIG. 3). In such an embodiment, the second driving low-voltage line 157 is not provided with the opening 302 for connection with the cathode electrode 270, and the driving low voltage ELVSS may be applied to each pixel through a driving low voltage transmitting line 160 (shown in FIG. 3).

Hereinafter, the plurality of transistors T1, T2 and T3 will be described in greater detail.

In an exemplary embodiment, the driving transistor T1 is a transistor that adjusts an amount of a current outputted corresponding to the data voltage DATA applied to a gate electrode, and the outputted driving current is applied to the organic light emitting diode OLED to adjust brightness of the organic light emitting diode OLED based on the data voltage DATA. In such an embodiment, a first electrode (input side electrode) of the driving transistor T1 is connected to the driving voltage ELVDD, and a second electrode (output side electrode) is connected to a first electrode (hereinafter also referred to as an anode electrode or a pixel electrode) of the organic light emitting diode OLED. A gate electrode of the driving transistor T1 is connected to a second electrode (output side electrode) of the second transistor T2 to receive the data voltage DATA.

The gate electrode of the driving transistor T1 is connected to one electrode of the storage capacitor Cst. The storage capacitor Cst allows the data voltage DATA transmitted to the gate electrode of the driving transistor T1 to be maintained for one frame. Thus, a voltage of the gate electrode of the driving transistor T1 is changed according to a voltage stored in the storage capacitor Cst, and accordingly, a driving current outputted from the driving transistor T1 may be constantly outputted for one frame.

The second transistor T2 (also referred to as a switching transistor) is a transistor for the data voltage DATA to be received into the pixel. The gate electrode is connected to the scan line 151, the first electrode is connected to the data line 171, and the second electrode (output side electrode) is connected to the gate electrode of the driving transistor T1. When the second transistor T2 is turned on in response to the scan signal Sn transmitted through the scan line 151, the data voltage DATA transmitted through the data line 171 is transmitted to the gate electrode of the driving transistor, and then is stored in the storage capacitor Cst.

The third transistor T3 (also referred to as an initializing transistor or a sensing transistor) serves to initialize the second electrode (output side electrode) of the driving transistor T1, one electrode of the storage capacitor Cst, and the anode electrode of the organic light emitting diode OLED. The gate electrode of the third transistor T3 is connected to the previous scan line 152, and the first electrode of the third transistor T3 is connected to the initializing voltage line 173. The second electrode (output side electrode) of the third transistor T3 is electrically connected to the second electrode (output side electrode) of the driving transistor T1, thereby being connected to the anode electrode of the organic light emitting diode OLED and the light emitting diode capacitor $C_{OLED}$. The light emitting diode capacitor $C_{OLED}$ holds an anode electrode voltage.

The initializing voltage line 173 not only provides the initializing voltage, but is also used as a wire for sensing a voltage of an anode electrode connected to the second electrode of the third transistor T3 during any period, and is also referred to as a sensing line. Accordingly, the third transistor T3 is also referred to as a sensing transistor.

An operation of the third transistor T3 will now be described in detail. A voltage of the anode electrode when the organic light emitting diode OLED emits light (emission period) is stored in one electrode of the storage capacitor Cst. In this case, the data voltage DATA is stored in another electrode of the storage capacitor Cst. Accordingly, when a gate-on voltage is applied to the gate electrode of the third transistor T3, the initializing voltage line 173 operates as a sensing line, and the voltage of the anode electrode is transmitted to a sensing portion (not shown) through the sensing line. Hereinafter, a portion of a frame period in which the initializing voltage line 173 operates as a sensing line will be referred to as a sensing period. Then, in the remainder of the frame period in which the gate-on voltage is applied to the gate electrode of the third transistor T3, the initializing voltage is applied by the initializing voltage line 173 such that the anode electrode voltage is initialized. Hereinafter, the remainder of the frame period will be referred to as an initializing period.

When the voltage sensed in the sensing period is different from an expected anode electrode voltage based on the applied data voltage DATA, the data voltage DATA may be corrected and provided to the pixel. That is, characteristics of the driving transistor T1 may be changed, and the changed characteristics of the driving transistor T1 may be sensed and the data voltage DATA corresponding to the changed characteristics may be provided, thereby allowing the organic light emitting diode OLED to normally emit light.

In such an embodiment, each of the two electrodes of the storage capacitor Cst is desired to maintain the data voltage DATA and the anode electrode voltage of the organic light emitting diode OLED (the output side electrode voltage of the driving transistor) for one frame.

An operation of one pixel of the organic light emitting diode display according to an exemplary embodiment will now be described in detail with reference to FIG. 1 and FIG. 2.

Figure 2:
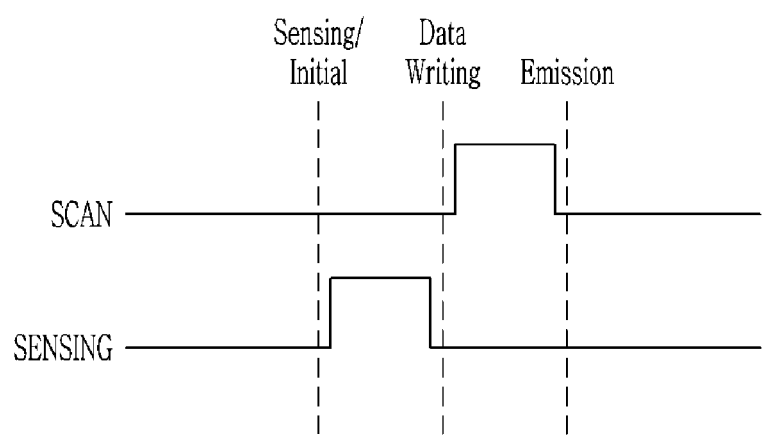
FIG. 2 illustrates a signal timing diagram of a signal applied to one pixel of an organic light emitting diode display according to an exemplary embodiment.

FIG. 2 illustrates a signal timing diagram of a signal applied to one pixel of the organic light emitting diode display according to the exemplary embodiment.

In FIG. 2, a signal indicated by 'SCAN' is a signal applied to the scan line 151, and a signal indicated by 'SENSING' is a signal applied to the previous scan line 152.

First, a high-level previous scan signal is supplied to the pixel through the previous scan line 152 during the 'Sensing/Initial' period. Then, the third transistor T3 to which the high-level previous scan signal is applied is turned on. In this case, the voltage stored in the anode electrode of the organic light emitting diode OLED is determined through the initializing voltage line 173 (sensing period), and then the voltage of the anode electrode of the organic light emitting diode OLED is changed to the initializing voltage (initial period).

When the driving transistor T1 in each pixel has a different threshold voltage due to the sensing period or process dispersion or when the characteristics of the driving transistor T1 are changed due to operation for a long period of time, such difference in threshold voltage may be sensed so that the organic light emitting diode OLED normally emits light.

Thereafter, during a 'Data Writing' period, the high-level scan signal Sn is supplied to the pixel through the scan line 151. The second transistor T2 is turned on by the high-level scan signal Sn. When the second transistor T2 is turned on, the data voltage DATA is inputted to the gate electrode of the driving transistor T1 via the second transistor T2 and is stored in one electrode of the storage capacitor Cst.

The driving transistor T1 is determined to be turned on based on the data voltage DATA applied to the gate electrode, and the driving transistor T1 outputs the driving voltage ELVDD to the anode electrode of the organic light emitting diode OLED.

The anode electrode voltage of the organic light emitting diode OLED is stored in the storage capacitor Cst, and is maintained for one frame.

In the above, the circuit structure and the circuit operation have been mainly described with reference to FIG. 1 and FIG. 2.

Hereinafter, structure of an exemplary embodiment of a pixel will be described with reference to FIG. 3 to FIG. 9. In an exemplary embodiment, the pixel corresponds to an area occupied by a circuit portion when the circuit portion and the light emitting element portion are divided. Two or more pixel regions (PX1, PX2, . . . ) collectively define one pixel group PX. In an exemplary embodiment, each pixel region (PX1, PX2, . . . ) includes a plurality of thin film transistors T1, T2 and T3, and may correspond to one area surrounded by the scan line 151, the previous scan line 152, the driving voltage line 155, the data line 171 and the initializing voltage line 173. In such an embodiment, each pixel region (PX1, PX2, . . . ) may be an area surrounded by the first driving low-voltage line 156 and a portion of the second driving low-voltage line 157. An exemplary embodiment, the organic light emitting diode display may include three pixel groups (P×1 and P×2), (P×3 and P×4), and (P×5 and P×6). In such an embodiment, the first pixel group includes two pixel regions PX1 and PX2, the second pixel group includes two pixel regions PX3 and PX4, and the third pixel group includes two pixel regions PX5 and PX6.

In an exemplary embodiment, as shown in FIG. 3 to FIG. 9, the driving voltage line 155, which is disposed to extend through areas between the first pixel region PX1 and the second pixel region PX2 of the pixel group including the first and second pixel regions PX1 and PX2, is included, and the first driving low-voltage lines 156 disposed at right and left sides of the first, second and third pixel groups (PX1 and PX2), (PX3 and PX4) and (PX5 and PX6), are included. In such an embodiment, the second driving low-voltage lines 157 positioned to extend through areas between the first pixel group (PX1 and PX2) and the second pixel group (PX3 and PX4), and between the second pixel group (PX3 and PX4) and the third pixel group (PX5 and PX6). Hereinafter, an arrangement of the driving voltage line 155, the first driving low-voltage line 156, and the second driving low-voltage line 157 and an effect according to the arrangement will be described in greater detail with reference to FIG. 3 to FIG. 7.

Figure 4:
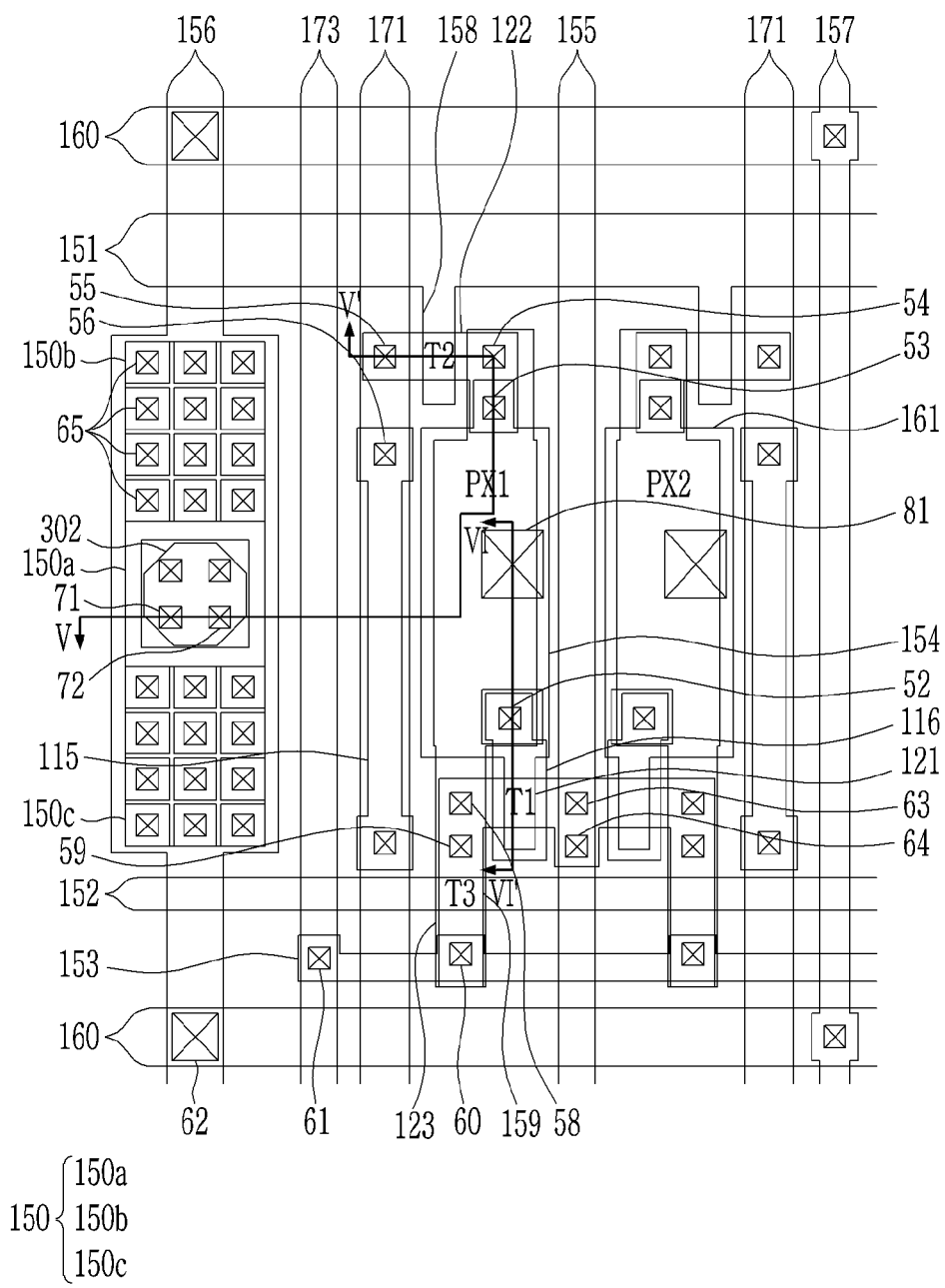
FIG. 4 illustrates a plan view of a plurality of pixel regions of an organic light emitting diode display according to an exemplary embodiment.
Figure 5:
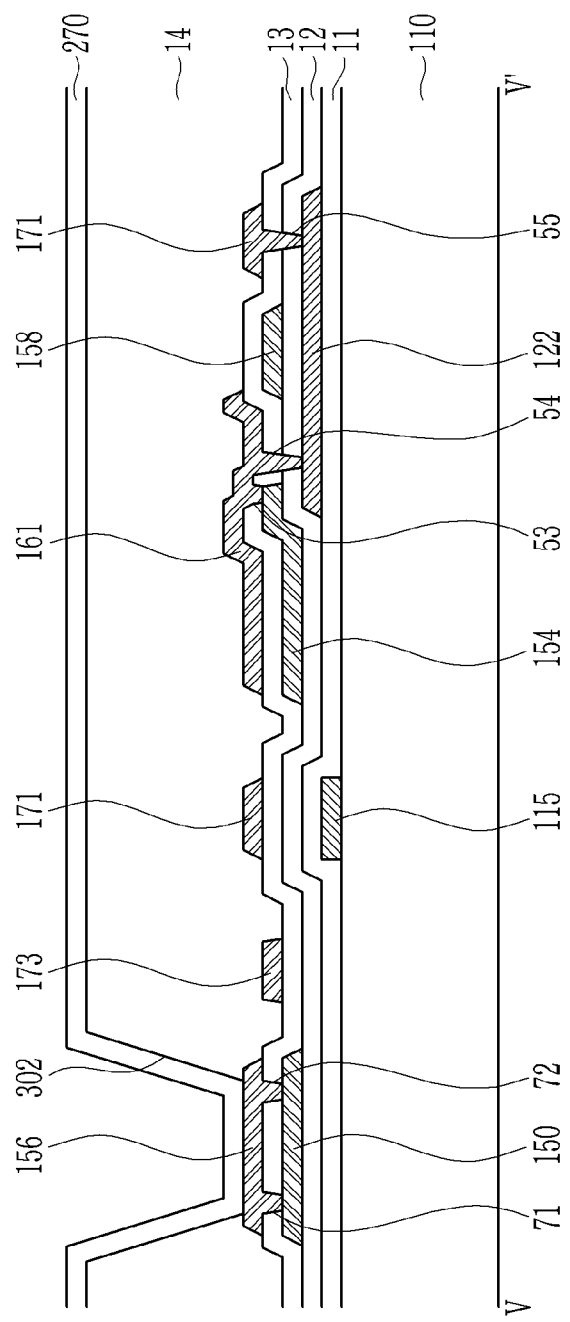
FIG. 5 illustrates a cross-sectional view taken along line V-V' of FIG. 4.
Figure 6:
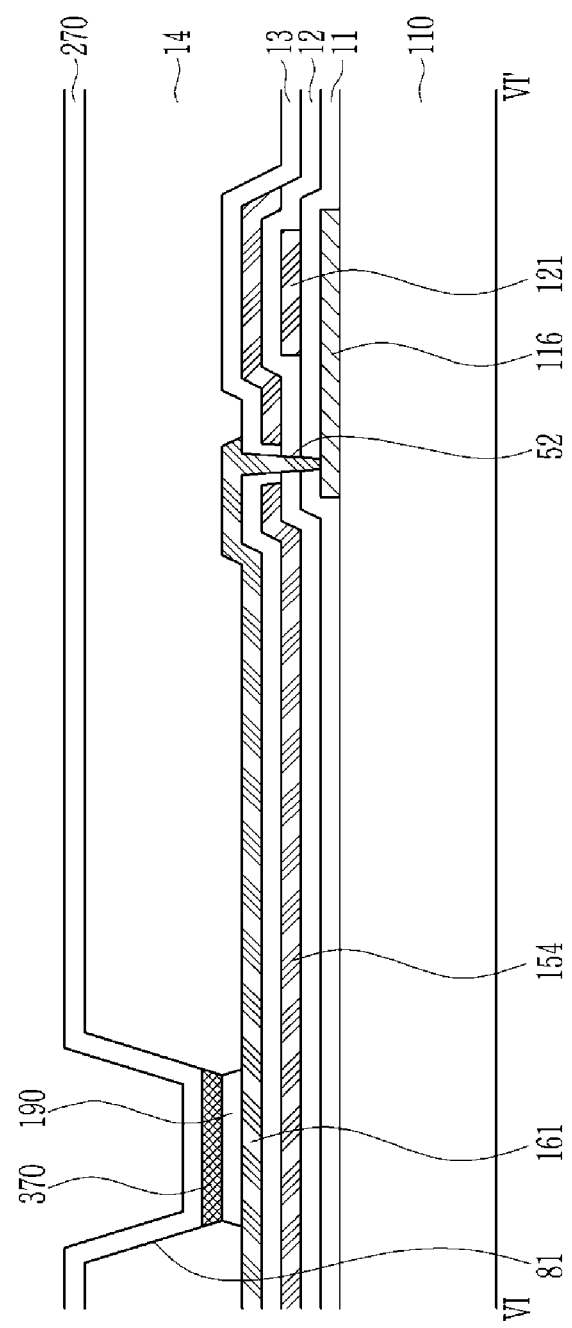
FIG. 6 illustrates a cross-sectional view taken along line VI-VI' of FIG. 5.

FIG. 3 and FIG. 4 illustrate plan views of a plurality of pixels of an organic light emitting diode display according to an exemplary embodiment, and FIG. 5 and FIG. 6 illustrate cross-sectional views taken along line V-V' and line VI-VI' of FIG. 4, respectively.

Referring to FIG. 3 to FIG. 6, an exemplary embodiment of an organic light emitting diode display includes a metal layer (115 and 116), a semiconductor layer (120, 121, 122, and 123), a gate layer (150, 151, 152, 153, and 154), a data layer (171, 173, 155, 156, and 157), a pixel electrode layer, an anode electrode 190, an organic light emitting layer 370, and a cathode electrode 270 on a substrate 110, and such layers may be insulated from each other with an insulating layer interposed therebetween unless they are connected to each other by contact holes.

The substrate 110 may be a glass substrate or a flexible substrate including plastic or polyimide ("PI"). In an exemplary embodiment, where the substrate is the flexible substrate, an additional inorganic insulating layer may be further provided.

The metal layer (115 and 116) disposed on the substrate 110 will now be described. The metal layer (115 and 116) includes a first metal layer 115 and a second metal layer 116 depending on a formation position thereof. The first metal layer 115 overlaps a portion of the data line 171 and is connected to the data line 171. The first metal layer 115 may be extend in a same direction as the data line 171 and may have a same width as the data line 171. The second metal layer 116 partially overlaps a gate electrode 154 of the driving transistor T1 and a storage electrode 161, and is connected to the gate electrode 154 and the storage electrode 161. Since the storage electrode 161 receives the voltage of the anode electrode, the second metal layer 116 receives the voltage of the anode electrode. The second metal layer 116 may overlap the gate electrode 154 of the driving transistor T1 to form a capacitor.

A buffer layer 11 is disposed on the substrate 110 and the first and second metal layers 115 and 116. The buffer layer 11 may include or be made of an inorganic insulating material.

The semiconductor layer (121, 122, and 123) is disposed on the buffer layer 11. The semiconductor layer (121, 122, and 123) includes semiconductors 121, 122, and 123 of respective transistors, and the semiconductors 121, 122, and 123 of the respective transistors include channels of the driving transistor T1, the second transistor T2, and the third transistor T3. The semiconductor layer (121, 122, and 123) may include or be formed of an oxide semiconductor. The first semiconductor 121 is a semiconductor layer of the driving transistor T1, and includes a channel region, and a source region and a drain region respectively disposed at opposite sides of the channel region. The second semiconductor layer 122 is a semiconductor layer of the second transistor T2, and includes a channel region, and a source region and a drain region disposed at opposite sides of the channel region, and the third semiconductor layer 123 is a semiconductor layer of the third transistor T3, and includes a channel region, and a source region and a drain region disposed at opposite sides of the channel region.

The source region and the drain region of each of the semiconductors 121, 122, and 123 are electrically connected to the first electrode and the second electrode, respectively. The source region and the drain region are extended and electrically connected to another layer through a contact hole.

The drain region of a first semiconductor 121 may be connected to the drain region of a third semiconductor 123 and may be integrally formed as a single and unitary unit. The drain region of a second semiconductor 122 may overlap the storage electrode 161.

A first gate insulating layer 12 is disposed on the semiconductor layer (121, 122, and 123) and the buffer layer 11. The first gate insulating layer 12 may include or be formed of an inorganic insulating material. The gate layer (150, 151, 152, 153, 154, 158, 159, and 160) is disposed on the first gate insulating layer 12. The gate layer (150, 151, 152, 153, and 154) includes a low voltage gate connector 150, the scan line 151, the previous scan line 152, an initializing voltage transmitting conductor 153, the gate electrode 154 of the driving transistor T1, a gate electrode 158 of the second transistor T2, a gate electrode 159 of the third transistor T3, and the driving low voltage transmitting line 160.

In an exemplary embodiment, as shown in FIG. 4, the low-voltage gate connector 150 has a rectangular island-like structure formed in a second direction (vertical direction). The low-voltage gate connector 150 overlaps the first driving low-voltage line 156, and is electrically connected through a plurality of contact holes. In such an embodiment, a portion of the first driving low-voltage line 156 may be irradiated with a laser to be electrically connected to the cathode electrode 270.

In an exemplary embodiment, as shown in FIG. 4, the scan line 151 extends in a first direction (horizontal direction), and the previous scan line 152 also extends in the first direction.

The initializing voltage transmitting conductor 153 has an island-like structure that extends in the first direction. The initializing voltage transmitting conductor 153 connects a plurality of pixels to the initializing voltage line 173 for each predetermined number of pixel columns. That is, the initializing voltage transmitting conductor 153 passes a plurality of pixel regions adjacent thereto in the first direction, and extends to a position at which the initializing voltage line 173 is disposed. In such an embodiment, the initializing voltage lines 173 are connected to three pixel regions PX1, PX2, and PX3, and a single initializing voltage line 173 is formed at each of respective sides of the three pixel regions PX1, PX2, and PX3.

The driving low voltage transmitting line 160 extends in the first direction (or a horizontal direction) and intersects the first and second driving low-voltage lines 156 and 157 extending in the second direction (or the vertical direction). The driving low voltage transmitting line 160 is disposed between pixels adjacent thereto in the second direction, and is electrically connected to the first and second driving low-voltage lines 156 and 157 through a contact hole 62 between the adjacent pixels PX1, PX2, PX3, PX4, PX5, and PX6 in the first direction.

In an exemplary embodiment, two first driving low-voltage lines 156 extend in the second direction with the first pixel group (PX1 and PX2), the second pixel group (PX3 and PX4), and the third pixel group (PX5 and PX6), and the two first driving low-voltage lines 156 are electrically connected to the driving low voltage transmitting line 160 through the contact hole 62. In such an embodiment, two second driving low-voltage lines 157 are electrically connected to the driving low-voltage transmitting line 160 through the contact hole 62 with any one of the first pixel group (PX1 and PX2), the second pixel group (PX3 and PX4), and the third pixel group (PX5 and PX6) therebetween.

According to an exemplary embodiment, since an area of the opening 302 for connecting the first driving low-voltage line 156 and the cathode electrode 270 is reduced, a voltage drop may occur in pixels away from a voltage supply (not shown), that is, the pixel regions PX2, PX3, PX4, and PX5 disposed at a central portion. In such an embodiment, by disposing the second driving low-voltage line 157 with one pixel group therebetween, a voltage may be maintained constant in the pixel regions PX2, PX3, PX4, and PX5 disposed at the central portion.

However, the invention is not limited to the exemplary embodiments described above, and in an alternative exemplary embodiment, the first driving low-voltage lines 156 may be disposed at opposite sides of 3×n pixel groups to be connected to the driving low voltage transmitting line 160 through the contact hole 62. Here, n is a natural number. That is, the first driving low-voltage lines 156 may be disposed at opposite sides of six pixel groups and nine pixel groups as well as three pixel groups to be connected to the driving low-voltage transmitting line 160 through the contact hole 62. In such an embodiment, the second driving low-voltage lines 157 may be disposed at opposite sides of the two pixel groups as well as one pixel group to be connected to the driving low voltage transmitting line 160 through the contact hole 62.

The gate electrode 154 of the driving transistor T1 includes an overlap portion overlapping the first semiconductor 121 in which a channel of the driving transistor T1 is disposed, and an expansion portion extending and expanding from the overlap portion. In such an embodiment, the overlap portion of the gate electrode 154 of the driving transistor T1 may define or function as a gate electrode, and the expansion portion may define one electrode of the storage capacitor Cst. The overlap portion of the gate electrode 154 may overlap the second metal layer 116 to form a capacitor. The expansion portion of the gate electrode 154 overlaps the drain region of the second transistor T2, and the expansion portion is connected to the second semiconductor 122 of the second transistor T2 through a contact hole 53 to receive the data voltage DATA from the second electrode of the second transistor T2.

The gate electrode 158 of the second transistor T2 may be defined by a portion protruding from the scan line 151, and a channel of the second transistor T2 is defined at a position where the second semiconductor 122 of the second transistor T2 and the gate electrode 158 overlap.

The gate electrode 159 of the third transistor T3 may be defined by a portion at which the previous scan line 152 and the third semiconductor 123 of the third transistor T3 cross each other. A channel of the third transistor T3 is defined at a position where the third semiconductor 123 and the gate electrode 159 overlap.

An interlayer insulating layer 13 is disposed on the gate layer (150, 151, 152, 153, 154, 158, 159, and 160) and the first gate insulating layer 12. The interlayer insulating layer 13 may include or be formed of an inorganic insulating material.

The storage electrode 161 and the data layer (171, 173, 155, 156, and 157) are disposed on the interlayer insulating layer 13. The storage electrode 161 has an expansion portion overlapping the expansion portion of the gate electrode 154 of the driving transistor T1, and includes a first extension portion and a second extension portion which extend upward and downward from the expansion portion, respectively. In such an embodiment, the expansion portion of the storage electrode 161 overlaps the gate electrode 154 to form the storage capacitor Cst. The first extension portion extending downward from the expansion portion of the storage electrode 161 is connected to the second electrode of the driving transistor T1 through contact holes 58 and 59, and is connected to the second metal layer 116 through a contact hole 52. The second extension portion extending upward from the expansion portion of the storage electrode 161 is connected to the second electrode of the second transistor T2 through a contact hole 54. The storage electrode 161 may be connected to an anode electrode (not shown) through a contact hole 81 defined or formed in the vicinity of a center of the expansion portion of the storage electrode 161.

The data layer includes the data line 171, the initializing voltage line 173, the driving voltage line 155, the first driving low-voltage line 156, and the second driving low-voltage line 157.

The data lines 171 are disopsed at opposite sides of one pixel group (PX1 and PX2), and extend in the second direction (vertical direction) perpendicular to the first direction. The data line 171 is connected to the source region (first electrode) of the second transistor T2 through a contact hole 55 to apply the data voltage DATA to the second transistor T2. The data line 171 includes a region overlapping the first metal layer 115. The data line 171 is connected to the first metal layer 115 through contact holes 56. In an exemplary embodiment, two data lines 171 are connected to each pixel group, e.g., to one pixel region PX1 and one pixel region PX2.

The initializing voltage line 173 extends in the second direction, and applies the initializing voltage. The initializing voltage lines 173 may be disposed at opposite sides of the plurality of pixel groups, and in an exemplary embodiment, two initializing voltage lines 173 are disposed at opposite sides of the three pixel groups. The initializing voltage line 173 is connected to the initializing voltage transmitting conductor 153 through a contact hole 61. The initializing voltage transmitting conductor 153 is connected to the source region (first electrode) of the third transistor T3 through a contact hole 60. Accordingly, in such an embodiment, the initializing voltage is applied to the first electrode of the third transistor T3 of each pixel.

The driving voltage line 155 and the first and second driving low-voltage lines 156 and 157 also extend in the second direction (longitudinal direction).

The driving voltage line 155 is disposed in a center of two adjacent pixel regions of one pixel group. In an exemplary embodiment, in one pixel group including the two pixel regions PX1 and PX2, it is disposed between the two pixel regions PX1 and PX2 to be connected to each of the pixel regions PX1 and PX2. The driving voltage line 155 transmits the driving voltage ELVDD, and is connected to the source region (first electrode) of the driving transistor T1 through contact holes 63 and 64 to transmit the driving voltage ELVDD to the first electrode of the driving transistor T1. The two pixel regions PX1 and PX2 of one pixel group are disposed to face each other with respect to the driving voltage line 155. The driving transistor T1 of each of the first and second pixel regions PX1 and PX2 may be disposed close to the driving voltage line 155, and the second transistor T2 may be disposed farther from the driving voltage line 155 than the driving transistor T1. A semiconductor of the driving transistor T1 of the first pixel region PX1 may be defined or formed by connecting the second pixel region PX2 with a semiconductor of the driving transistor T1. Therefore, the semiconductor region connected to the source region of the driving transistor T1 in the first pixel region PX1 may be the source region of the driving transistor T1 in the second pixel region PX2.

The first driving low-voltage line 156 is disposed on the side of the plurality of pixel groups, and transmits the driving low voltage ELVSS. The first driving low-voltage line 156 includes expansion portions 150a, 150b, and 150c, and extension portions extending from the expansion portions 150a, 150b, and 150c. In an exemplary embodiment, as shown in FIG. 4, the expansion portions 150a, 150b, and 150c overlap the low-voltage gate connector 150, and include a first portion 150a, which is a center portion, a second portion 150b, which is above the center portion, and a third portion 150c, which is below the center portion.

In such an embodiment, an opening 302 for transmitting the driving low voltage ELVSS to the cathode electrode 270 is defined to overlap the first portion 150a. Contact holes 71 and 72 for connecting the first driving low-voltage line 156 and the low voltage gate connector 150 are defined in the opening 302. a plurality of contact holes 65 are defined to overlap the second portion 150b and the third portion 150c for connecting the low-voltage gate connector 150 and the first driving low-voltage line 156. In an exemplary embodiment, 12 (=3×4) contact holes are defined or formed in the second portion 150b and the third portion 150c, but the number of contact holes may be variously modified. In an alternative exemplary embodiment, the openings 302 may be in the second portion 150b and the third portion 150c.

When the area of the opening 302 for connecting the first driving low-voltage line 156 and the cathode electrode 270 is reduced, a voltage drop may occur in pixels away from a voltage supply (not shown), that is, the pixel regions PX2, PX3, PX4, and PX5 disposed at a central portion. In an exemplary embodiment, the second driving low-voltage lines 157 are disposed at opposite sides of one pixel group, and transmit the driving low voltage ELVSS to respective pixel regions. Accordingly, in such an embodiment, by disposing the second driving low-voltage line 157 in one pixel group (PX1 and PX2), (PX3 and PX4), or (PX5 and PX6), a voltage may also be effectively maintained constant in the second pixel group (PX3 and PX4) disposed at the central portion.

However, the invention is not limited to the exemplary embodiment described above, and in an alternative exemplary embodiment, two first driving low-voltage lines 156 may be disposed in parallel with 3×n pixel groups therebetween. Here, n is a natural number of 1, 2, 3, and so on. In such an embodiment, the two first driving low-voltage lines 156 may be disposed with six pixel groups or nine pixel groups as well as three pixel groups therebetween.

A planarization layer 14 is disposed on the storage electrodes 161, the data layer (171, 173, 155, 156, and 157), and the interlayer insulating layer 13. The planarization layer 14 may include or be formed of an organic insulating material, and provides a flat surface for layers therebelow. A pixel electrode layer is disposed on the planarization layer 14, and an anode electrode 190 is disposed on the pixel electrode layer.

The anode electrode 190 transmits a current, which is outputted thereto from the driving transistor T1, to the organic light emitting layer 370. The anode electrode 190 is connected to the storage electrode 161 through the contact hole 81 to receive the current outputted from the driving transistor T1. The cathode electrode 270 is disposed on the organic light emitting layer 370, and the cathode electrode 270 is connected to the first driving low-voltage line 156 through the opening 302 defined or formed in the planarization layer 14. The first driving low-voltage line 156 is connected to the low-voltage gate connector 150 through the contact holes 71 and 72 defined or formed in the interlayer insulating layer 13.

The structure of the plurality of pixels of the organic light emitting diode display according to an exemplary embodiment has been described.

According to exemplary embodiments of the organic light emitting diode display, the first driving low-voltage lines 156 are disposed at opposite sides of three or more pixel groups and two pixel regions are disposed to be driven by a single driving voltage line 155, thus high resolution may be realized in a reduced pixel space, and the gate wire and the data wire may be widely formed even in the small pixel space.

Hereinafter, effects due to the arrangement of the driving voltage line 155, the first driving low-voltage line 156, and the second driving low-voltage line 157 of the organic light emitting diode display according to an exemplary embodiment will be described in detail in comparison with a comparative embodiment.

TABLE 1

| Classification | Comparative Embodiment | Exemplary Embodiment |
| --- | --- | --- |
| 1 period | 1.9 µs | 1.9 µs |
| Arrangement of driving low-voltage line | 3 pixels 1 line | 6 pixels 3 lines |
| Arrangement of driving voltage line | 1 pixel 1 line | 2 pixels 1 line |
| Thickness of gate layer/data layer | 0.7 µm | 0.7 µm |
| Gate layer resistance (R) | 5750 Ω | 2510 Ω |
| Line width of gate layer | 8 µm | 16 µm |
| Gate layer capacitance (C) | 656 F | 767 F |
| Data layer resistance (R) | 4523 Ω | 2720 Ω |
| Line width of data layer | 4.5 µm | 8 µm |
| Data layer capacitance (C) | 204 F | 227 F |
| (Gate R*C)/4 | 0.943 µs | 0.481 µs |
| Data R*C | 0.923 µs | 0.617 µs |
| 2*Data R*C | 1.846 µs | 1.234 µs |
| Total RC | 2.789 µs | 1.715 µs |

Referring to Table 1, the comparative embodiment of an organic light emitting diode display has two driving low-voltage lines disposed at opposite sides of one pixel group including three pixel regions, and a single driving voltage line is connected to a left or right side of one pixel region to drive the organic light emitting diode display.

In an exemplary embodiment of the organic light emitting diode display according to the invention has three driving low-voltage lines that are disposed with one pixel group including two pixel regions therebetween. That is, the first driving low-voltage lines 156 are disposed with three pixel groups therebetween, and the second driving low-voltage lines 157 are disposed with one pixel group therebetween. Here, the opening 302 is defined or formed for one first driving low-voltage line 156, and no opening is formed for two second driving low-voltage lines 157.

The first driving low-voltage line 156 having a width of at least 40 micrometers (µm) is desired to form the opening 302 for electrically connecting the cathode electrode 270 and the first driving low-voltage line 156, and according to an exemplary embodiment, by disposing the first driving low-voltage line 156 with the pixel groups (PX1 and PX2), (PX3 and PX4), and (PX5 and PX6) therebetween, a free space is secured in the entire pixels, thus the wire of the gate layer may be widened from 8 µm to 16 µm and the wire of the data layer may be widened from 4.5 µm to 8 µm. As the wires of the gate layer and the data layer are widened, the resistance of the gate layer and the resistance of the data layer are reduced by about 50%.

Therefore, a total resistance-capacitance ("RC") delay of the pixel according to an exemplary embodiment is reduced to 1.715 µm. Since one pixel according to an exemplary embodiment is driven at a time faster than 1.9 microseconds (µs) which is one period of driving of the pixel, one data wire may be driven by one gate wire.

In an exemplary embodiment, since the gate layer and data layer resistances may be reduced by maintaining the capacitance of the gate layer and the data layer and increasing the widths of the gate wire and the data wire, the thicknesses of the gate layer wire and the data layer wire may be constantly maintained at about 0.7 µm. Since the wires are formed to have a thickness equal to or less than about 0.7 µm, the driving margin of the organic light emitting diode display according to an exemplary embodiment may be secured.

That is, according to an exemplary embodiment, as each pixel region connected to a single driving voltage line and a single driving low-voltage line increases, a space for accommodate the gate layer wire and the data layer wire is sufficiently widely secured. In such an embodiment, when the widths of the gate layer wire and the data layer wire are formed to be wide, such that an RC delay reduction effect may be effectively secured for a high resolution driving margin.

According to an exemplary embodiment, the gate layer wire and the data layer wire may be widely formed. Hereinafter, a structure in which the gate layer wire is widely formed will be described with reference to FIG. 7 and FIG. 8.

Figure 7:
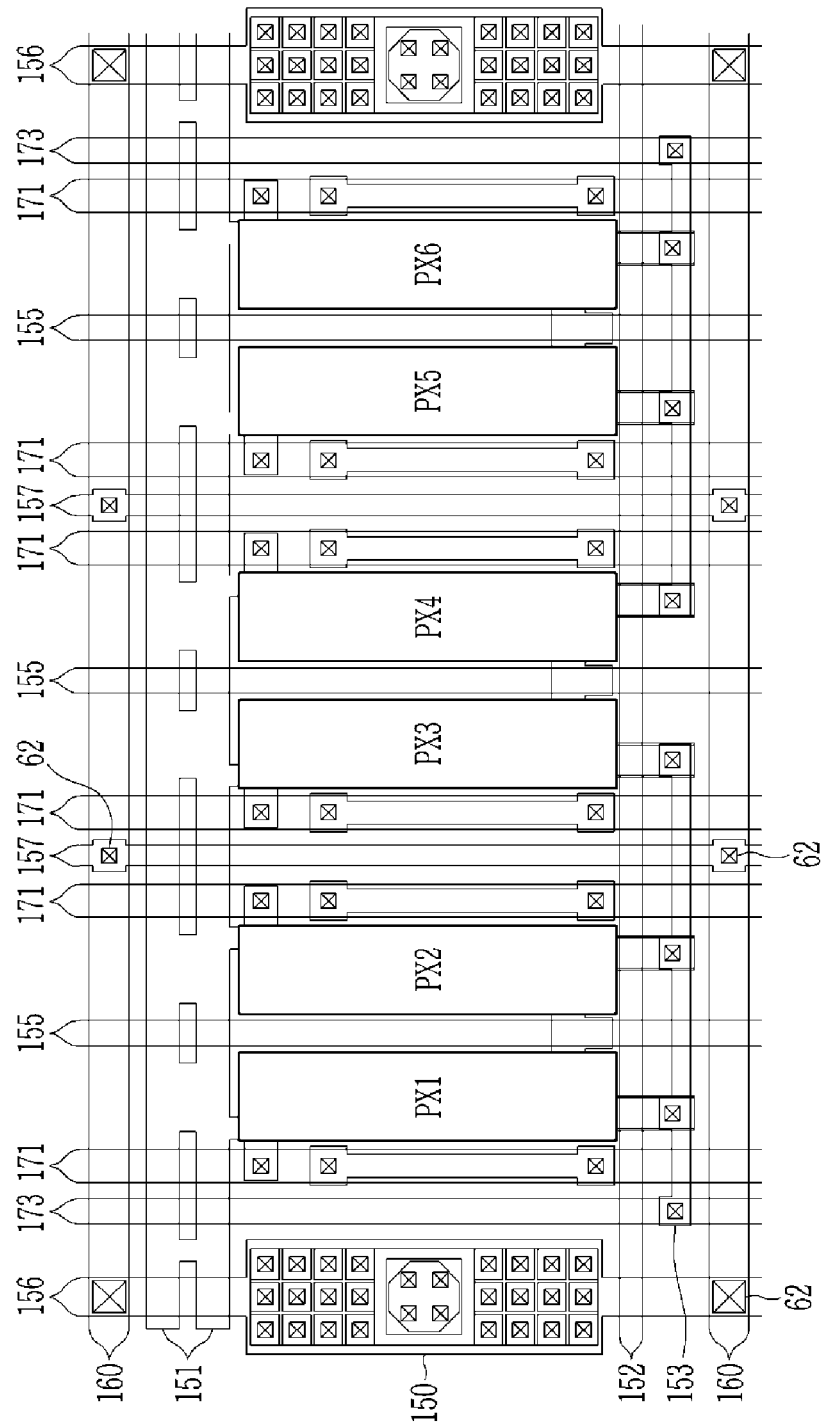
FIG. 7 illustrates a plan view of a plurality of pixels of an organic light emitting diode display according to an exemplary embodiment.
Figure 8:
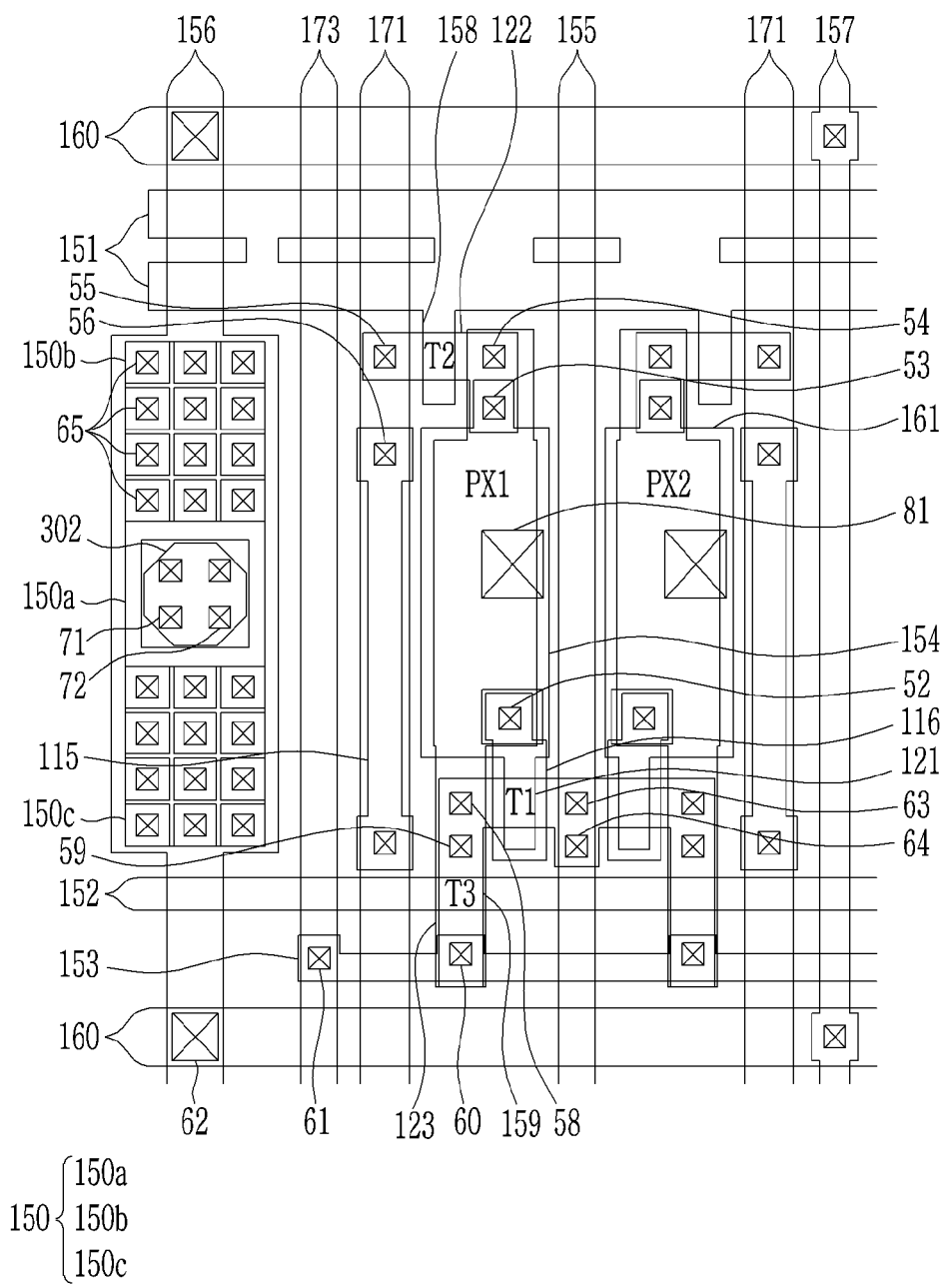
FIG. 8 illustrates a plan view of a plurality of pixel regions of an organic light emitting diode display according to an exemplary embodiment.

FIG. 7 illustrates a plan view of a plurality of pixels of an organic light emitting diode display according to an exemplary embodiment, and FIG. 8 illustrates a plan view of a plurality of pixels of an organic light emitting diode display according to an exemplary embodiment.

Referring to FIG. 7 and FIG. 8, an exemplary embodiment of an organic light emitting diode display includes the metal layer (115 and 116), the semiconductor layer (120, 121, 122, and 123), the gate layer (150, 151, 152, 153, and 154), and the data layer (171, 173, 155, 156, and 157), and such layers are insulated from each other with an insulating layer therebetween unless connected by contact holes. The metal layer (115 and 116) is disposed on the substrate 110, and the metal layer (115 and 116) includes a first metal layer 115 and a second metal layer 116, depending on formation positions thereof.

The buffer layer 11 may be disposed on the substrate 110 and the first and second metal layers 115 and 116, and the buffer layer 11 may include or be formed of an inorganic insulating material.

The semiconductors 121, 122, and 123 of each transistor are disposed on the buffer layer 11, and the semiconductors 121, 122, and 123 of each transistor include the channels of the driving transistor T1, the second transistor T2, and the third transistor T3. The first semiconductor 121 is a semiconductor layer of the driving transistor T1, and includes a channel region, and a source region and a drain region disposed at opposite sides of the channel region. The second semiconductor 122 is a semiconductor of the second transistor T2, and includes a channel region, and a source region and a drain region disposed at opposite sides of the channel region, and the third semiconductor 123 is a semiconductor of the third transistor T3, and includes a channel region, and a source region and a drain region disposed at opposite sides of the channel region.

The first gate insulating layer 12 may be disposed on the semiconductor layer (121, 122, and 123) and the buffer layer 11, and the first gate insulating layer 12 may include or be formed of an inorganic insulating material.

The gate layer (150, 151, 152, 153, 154, 158, 159, and 160) may be disposed on the first gate insulating layer 12. The gate layer (150, 151, 152, 153, and 154) includes the low voltage gate connector 150, the scan line 151, the previous scan line 152, the initializing voltage transmitting conductor 153, the gate electrode 154 of the driving transistor T1, the gate electrode 158 of the second transistor T2, the gate electrode 159 of the third transistor T3, and the driving low voltage transmitting line 160.

The low-voltage gate connector 150 has a rectangular island-like structure extending in the second direction (vertical direction). The low-voltage gate connector 150 overlaps the first driving low-voltage line 156 and is electrically connected thereto through a plurality of contact holes 65. In an exemplary embodiment, a portion of the first driving low-voltage line 156 may be irradiated with a laser to be electrically connected to the cathode electrode 270.

In an exemplary embodiment, as shown in FIG. 7, the scan line 151 extends in the first direction (horizontal direction), and the previous scan line 152 extends in the first direction (horizontal direction). The scan line 151 is divided into or branched off two lines in an area not intersecting the data layer wire, and the two lines are bridged to occupy a wide area. The scan line 151 includes a bridge, and may effectively be repaired when a short circuit occurs in an area intersecting the data layer wire. This will be described in greater detail with reference to FIG. 9.

The initializing voltage transmitting conductor 153 has an island-like structure that extends in the first direction. The initializing voltage transmitting conductor 153 is an element for connecting the initializing voltage line 173 provided for each predetermined number of pixel columns to the plurality of pixels. That is, the initializing voltage transmitting conductor 153 extends through a plurality of pixel regions adjacent thereto in the first direction and extends to a position at which the initializing voltage line 173 is disposed. In an exemplary embodiment, as shown in FIG. 7, the initializing voltage lines 173 are connected to three pixel regions PX1, PX2, and PX3, and they are formed at each of respective sides of the three pixel regions PX1, PX2, and PX3.

The driving low voltage transmitting line 160 extends in the first direction, and intersects the first and second driving low-voltage lines 156 and 157 extending in the second direction. Driving low voltage transmitting lines 160 are disposed between pixels adjacent thereto in the second direction, and is electrically connected to the first and second driving low-voltage lines 156 and 157 through the contact hole 62 between the adjacent pixels PX1, PX2, PX3, PX4, PX5, and PX6 in the first direction.

In an exemplary embodiment, two first driving low-voltage lines 156 extend in the second direction in the sides of the first pixel group (PX1 and PX2), the second pixel group (PX3 and PX4), and the third group (PX5 and PX6), and the two first driving low-voltage lines 156 are electrically connected to the driving low voltage transmitting lines 160 through the contact hole 62. In such an embodiment, two second driving low-voltage lines 157 are electrically connected to the driving low-voltage transmitting line 160 through the contact hole 62 in opposite sides of any one of the first pixel group (PX1 and PX2), the second pixel group (PX3 and PX4), and the third pixel group (PX5 and PX6) therebetween.

According to an exemplary embodiment, as shown in FIG. 8, since the area of the opening 302 for connecting the first driving low-voltage line 156 and the cathode electrode 270 is reduced, a voltage drop may occur in pixels away from a voltage supply (not shown), that is, the pixel regions PX2, PX3, PX4, and PX5 disposed at a central portion. In such an embodiment, by disposing the second driving low-voltage lines 157 at opposite sides of one pixel group, a voltage may be maintained constant in the pixel regions PX2, PX3, PX4, and PX5 disposed at the central portion. However, the invention is not limited to the exemplary embodiments described above, and alternatively, the first driving low-voltage lines 156 may be disposed at opposite sides of 3×n pixel groups to be connected to the driving low voltage transmitting line 160 through the contact hole 62. Here, n is a natural number of 1, 2, 3, and so on. That is, the first driving low-voltage lines 156 may be disposed at opposite sides of six pixel groups and nine pixel groups as well as three pixel groups to be connected to the driving low-voltage transmitting line 160 through the contact hole 62. In an exemplary embodiment, the second driving low-voltage lines 157 may be disposed at opposite sides of the two pixel groups as well as one pixel group to be connected to the driving low voltage transmitting line 160 through the contact hole 62.

The gate electrode 154 of the driving transistor T1 includes an overlap portion overlapping the first semiconductor 121 in which a channel of the driving transistor T1 is disposed, and an expansion portion extending and expanding from the overlap portion. In an exemplary embodiment, the overlap portion of the gate electrode 154 of the driving transistor T1 functions as the gate electrode 154, and the expansion portion defines one electrode of the storage capacitor Cst. The overlap portion of the gate electrode 154 may overlap the second metal layer 116 to form a capacitor. The expansion portion of the gate electrode 154 overlaps the drain region of the second transistor T2, and the expansion portion is connected to the second semiconductor 122 of the second transistor T2 through a contact hole 53 to receive the data voltage DATA from the second electrode of the second transistor T2.

The gate electrode 158 of the second transistor T2 is a portion protruding from the scan line 151, and a channel of the second transistor T2 is formed at a position where the second semiconductor 122 of the second transistor T2 and the gate electrode 158 overlap.

The gate electrode 159 of the third transistor T3 is a portion at which the previous scan line 152 and the third semiconductor 123 of the third transistor T3 cross each other. A channel of the third transistor T3 is formed at a position at which the third semiconductor 123 and the gate electrode 159 overlap.

The interlayer insulating layer 13 is disposed on the gate layer (150, 151, 152, 153, 154, 158, 159, and 160) and the first gate insulating layer 12. The interlayer insulating layer 13 may include or be formed of an inorganic insulating material.

The storage electrode 161 and the data layer (171, 173, 155, 156, and 157) are disposed on the interlayer insulating layer 13.

The storage electrode 161 has an expansion portion overlapping the expansion portion of the gate electrode 154 of the driving transistor T1, and includes a first extension portion and a second extension portion which extend upward and downward from the expansion portion, respectively. Here, the expansion portion of the storage electrode 161 overlaps the gate electrode 154 to form the storage capacitor Cst. The first extension portion extending downward from the expansion portion of the storage electrode 161 is connected to the second electrode of the driving transistor T1 through the contact holes 58 and 59, and is connected to the second metal layer 116 through the contact hole 52. The second extension portion extending upward from the expansion portion of the storage electrode 161 is connected to the second electrode of the second transistor T2 through the contact hole 54. The storage electrode 161 may be connected to an anode electrode (not shown) through the contact hole 81 defined or formed in the vicinity of a center of the expansion portion of the storage electrode 161.

The data layer includes the data line 171, the initializing voltage line 173, the driving voltage line 155, the first driving low-voltage line 156, and the second driving low-voltage line 157.

The data lines 171 are disposed in opposite sides of one pixel group (PX1 and PX2), and extend in the second direction (vertical direction) perpendicular to the first direction. The data line 171 is connected to the source region (first electrode) of the second transistor T2 through the contact hole 55 to apply the data voltage DATA to the second transistor T2. The data line 171 includes a region overlapping the first metal layer 115. The data line 171 is connected to the first metal layer 115 through the contact holes 56. In an exemplary embodiment, two data lines 171 are connected to one pixel group, that is, to one pixel region PX1 and one pixel region PX2, respectively.

The initializing voltage line 173 extends in the second direction, and applies the initializing voltage. The initializing voltage lines 173 may be disposed at opposite sides of the plurality of pixel groups, and two initializing voltage lines 173 are disposed at opposite sides of the three pixel groups. The initializing voltage line 173 is connected to the initializing voltage transmitting conductor 153 through the contact hole 61. The initializing voltage transmitting conductor 153 is connected to the source region (first electrode) of the third transistor T3 through the contact hole 60. Accordingly, in such an embodiment, the initializing voltage is applied to the first electrode of the third transistor T3 of each pixel.

The driving voltage line 155 and the first and second driving low-voltage lines 156 and 157 also extend in the second direction (longitudinal direction).

The driving voltage line 155 is disposed in a center of two neighboring pixel regions. In an exemplary embodiment, in one pixel group including the two pixel regions PX1 and PX2, the driving voltage line 155 is disposed between the two pixel regions PX1 and PX2 to be connected to each of the pixel regions PX1 and PX2. The driving voltage line 155 transmits the driving voltage ELVDD, and is connected to the source region (first electrode) of the driving transistor T1 through the contact holes 63 and 64 to transmit the driving voltage ELVDD to the first electrode of the driving transistor T1. The two pixel regions PX1 and PX2 of one pixel group are disposed to face each other with respect to the driving voltage line 155. The driving transistor T1 of each of the first and second pixel regions PX1 and PX2 may be disposed close to the driving voltage line 155, and the second transistor T2 may be disposed farther from the driving voltage line 155 than the driving transistor T1. A semiconductor of the driving transistor T1 of the first pixel region PX1 may be formed by connecting the second pixel region PX2 with a semiconductor of the driving transistor T1. Therefore, the semiconductor region connected to the source region of the driving transistor T1 formed in the first pixel region PX1 may be the source region of the driving transistor T1 formed in the second pixel region PX2.

The first driving low-voltage line 156 is disposed on the side of the plurality of pixel groups, and transmits the driving low voltage ELVSS. The first driving low-voltage line 156 includes expansion portions 150a, 150b, and 150c and extension portions extending from the expansion portions 150a, 150b, and 150c. The expansion portions 150a, 150b, and 150c overlap the low-voltage gate connector 150, and include a first portion 150a that is a center portion, a second portion 150b that is above the center portion, and a third portion 150c that is below the center portion.

In an exemplary embodiment, an opening 302 is defined to overlap the first portion 150a for transmitting the driving low voltage ELVSS to the cathode electrode 270. The contact holes 71 and 72 for connecting the first driving low-voltage line 156 and the low voltage gate connector 150 are defined or formed in the opening 302. In such an embodiment, a plurality of contact holes 65 is defined to overlap the second portion 150b and the third portion 150c for connecting the low-voltage gate connector 150 and the first driving low-voltage line 156. In an exemplary embodiment, 12 (=3×4) contact holes 65 are defined or formed in the second portion 150b and the third portion 150c, but the number of the contact holes 65 may be variously modified. In an alternative exemplary embodiment, the openings 302 may be defined or formed to overlap the second portion 150b and the third portion 150c.

According to an exemplary embodiment, since the area of the opening 302 for connecting the first driving low-voltage line 156 and the cathode electrode 270 is reduced, a voltage drop may occur in pixels away from a voltage supply (not shown), that is, the pixel regions PX2, PX3, PX4, and PX5 disposed at a central portion. However, according to an exemplary embodiment, the second driving low-voltage lines 157 are disposed at opposite sides of one pixel group, and transmit the driving low voltage ELVSS to respective pixel regions. Therefore, by disposing the second driving low-voltage line 157 in one pixel group (PX1 and PX2), (PX3 and PX4), or (PX5 and PX6), a voltage may also be effectively maintained constant in the second pixel group (PX3 and PX4) disposed at the central portion.

However, the invention is not limited to the exemplary embodiments described above, and alternatively, two first driving low-voltage lines 156 may be disposed in parallel with 3×n pixel groups therebetween. Here, n is a natural number of 1, 2, 3, and so on. That is, the two first driving low-voltage lines 156 may be disposed with six pixel groups or nine pixel groups as well as three pixel groups therebetween.

The planarization layer 14 is disposed on the storage electrodes 161, the data layer (171, 173, 155, 156, and 157), and the interlayer insulating layer 13. The planarization layer 14 may include or be formed of an organic insulating material, and has a flat upper surface to planarize any step structure defined by layers therebelow.

A pixel electrode layer (not shown) is disposed on the planarization layer 14, and an anode electrode 190 is disposed on the pixel electrode layer.

The anode electrode 190 transmits a current, which is outputted from the driving transistor T1 to one electrode of the organic light emitting diode OLED, to the organic light emitting layer 370. The anode electrode 190 is connected to the storage electrode 161 through the contact hole 81 in order to receive the current outputted from the driving transistor T1. The cathode electrode 270 is disposed on the organic light emitting layer 370, and the cathode electrode 270 is connected to the first driving low-voltage line 156 through the opening 302 defined or formed in the planarization layer 14. The first driving low-voltage line 156 is connected to the low-voltage gate connector 150 through the contact holes 71 and 72 defined or formed in the interlayer insulating layer 13.

According to an exemplary embodiment of the organic light emitting diode display, the first driving low-voltage lines 156 are disposed at opposite sides of three or more pixel groups and two pixel regions are disposed to be driven by one driving voltage line 155, thus high resolution may be realized even in a small pixel space, and the gate wire and the data wire may be widely provided even in the small pixel space.

In such embodiments of the organic light emitting diode display, a sufficient space may be secured for providing the scan line 151 with two lines in the gate line, so that even when the scan line 151 and the data line 171 are short-circuited, a repair process may be effectively performed simply by cutting.

FIG. 9 illustrates a plan view of a plurality of pixel regions of an organic light emitting diode display according to an exemplary embodiment, in which a scan line is repaired.

Referring to FIG. 9, the scan line 151 includes two wires extending in the first direction and a bridge connecting the two wires. The bridge is disposed in a region that does not intersect the data line 171, the initializing voltage line 173, the driving voltage line 155, the first driving low-voltage line 156, and the second driving low-voltage line 157.

However, no bridges are provided in the scan line 151, and a short circuit may occur in a region X intersecting with the data layer (171, 173, 155, 156, and 157). In this case, in order to prevent the scan signal Sn and the data voltage DATA from interfering, a repair process for cutting the region X in which a short circuit occurs is performed.

When the region, in which the short circuit occurs, is cut as shown in FIG. 9, the scan line 151 includes a cut region C in some of the wires extending in the first direction. When the scan signal Sn is provided from one side of the scan line 151, the scan signal is applied to the gate electrode 158 of the second transistor T2 of the first pixel region PX1 through another wire extending in the first direction other than the cut region C, thereby transmitting the scan signal Sn without interruption.

In exemplary embodiments of the organic light emitting diode display according to the invention, the first driving low-voltage lines 156 are disposed at opposite sides of three or more pixel groups, and two pixel regions are driven by one driving voltage line 155, such that the scan line 151 may be formed to be wider with two wires even in a small pixel space. Therefore, since the scan line 151 including two wires and the bridge is provided, when a short circuit occurs in a region in which the scan line 151 and the data line 171 intersect, a repairing process may be performed simply by a cutting process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
    a plurality of pixel groups disposed in parallel in a first direction, wherein each of the plurality of pixel groups includes n1 pixel regions, and n1 is a natural number;
    a plurality of driving voltage lines disposed between two adjacent pixel regions of the n1 pixel regions and extending in a second direction intersecting the first direction to apply a driving voltage to the two adjacent pixel regions;
    a plurality of initializing voltage lines extending in the second direction to apply an initializing voltage to the plurality of pixel groups;
    a plurality of data lines extending in the second direction to apply a data voltage to the plurality of pixel groups;
    a plurality of first driving low-voltage lines extending in the second direction to apply a driving low voltage to the plurality of pixel groups; and
    a scan line extending in the first direction and intersecting the plurality of driving voltage lines, the plurality of initializing voltage lines, the plurality of data lines, and the plurality of first driving low-voltage lines,
    wherein 3×n2 pixel groups among the plurality of pixel groups are disposed between two directly adjacent first driving low-voltage lines of the plurality of first driving low-voltage lines, and n2 is a natural number.

2. The organic light emitting diode display of claim 1, further comprising:
    a plurality of second driving low-voltage lines extending in the second direction to apply the driving low voltage to the plurality of pixel groups,
    wherein a single pixel group of the plurality of pixel groups is disposed between two adjacent second driving low-voltage lines of the plurality of second driving low-voltage lines.

3. The organic light emitting diode display of claim 2, wherein
    the single pixel group of the plurality of pixel groups is disposed between two adjacent data lines of the plurality of data lines, and
    the 3×n2 pixel groups are disposed between two adjacent initializing voltage lines of the plurality of initializing voltage lines.

4. The organic light emitting diode display of claim 3, wherein
    three pixel groups of the plurality of pixel groups are disposed between the two adjacent first driving low-voltage lines.

5. The organic light emitting diode display of claim 4, further comprising:
    a driving low voltage transmitting line extending in the first direction,
    wherein the plurality of first driving low-voltage lines and the plurality of second driving low-voltage lines are electrically connected to the driving low voltage transmitting line.

6. The organic light emitting diode display of claim 1, further comprising:
    a plurality of openings is defined to overlap the plurality of first driving low-voltage lines.

7. The organic light emitting diode display of claim 6, further comprising:
    a cathode electrode electrically connected to the plurality of first driving low-voltage lines through the plurality of openings.

8. The organic light emitting diode display of claim 1, wherein
    the scan line includes two wires extending in the first direction and a bridge connecting the two wires to each other.

9. The organic light emitting diode display of claim 8, wherein
    the scan line includes a cut region in a portion where the two wires except for the bridge intersect one of the plurality of data lines.

10. The organic light emitting diode display of claim 1, wherein
    the plurality of pixel groups include at a pixel region including a thin film transistor, an anode electrode connected to the thin film transistor, and an organic light emitting layer disposed on the anode electrode.

11. An organic light emitting diode display, comprising:
    a plurality of pixel groups disposed in parallel in a first direction, wherein each of the plurality of pixel groups includes n1 pixel regions, and n1 is a natural number;
    a plurality of driving voltage lines disposed between two adjacent pixel regions of the n1 pixel regions and extending in a second direction intersecting the first direction to apply a driving voltage to the two adjacent pixel regions;

a plurality of initializing voltage lines extending in the second direction to apply an initializing voltage to the plurality of pixel groups;

a plurality of data lines extending in the second direction to apply a data voltage to the plurality of pixel groups;

a scan line including two wires extending in the first direction and a bridge connecting the two wires to each other; and a plurality of first driving low-voltage lines extending in the second direction, wherein two wires of the scan line intersect the plurality of driving voltage lines, the plurality of data lines, and the plurality of initializing voltage lines, and the bridge does not overlap any of the plurality of data lines, and wherein 3×n2 pixel groups among the plurality of pixel groups are disposed between two directly adjacent first driving low-voltage lines of the plurality of first driving low-voltage lines, n2 is a natural number.

12. The organic light emitting diode display of claim 11, further comprising:

a plurality of openings is defined to overlap the plurality of first driving low-voltage lines, and the organic light emitting diode display further comprises a cathode electrode electrically connected to the plurality of first driving low-voltage lines through the plurality of openings.

13. The organic light emitting diode display of claim 11, further comprising:

a plurality of second driving low-voltage lines extending in the second direction, wherein a single pixel group of the plurality of pixel groups is disposed between two adjacent second driving low-voltage lines of the plurality of second driving low-voltage lines.

14. The organic light emitting diode display of claim 13, wherein three of the plurality of pixel groups are disposed between the two adjacent first driving low-voltage lines.

15. The organic light emitting diode display of claim 14, further comprising:

a driving low voltage transmitting line extending in the first direction, wherein the plurality of first driving low-voltage lines and the plurality of second driving low-voltage lines are electrically connected to the driving low voltage transmitting line.

16. The organic light emitting diode display of claim 11, wherein the bridge does not overlap any of the plurality of driving voltage lines and the plurality of initializing voltage lines.

17. An organic light emitting diode display, comprising:

a substrate;

a metal layer disposed on the substrate;

a semiconductor layer disposed on the metal layer;

a gate insulating layer covering the semiconductor layer;

a gate layer including a low-voltage gate connector and disposed on the gate insulating layer;

an interlayer insulating layer covering the gate layer;

a storage electrode and a data layer disposed on the interlayer insulating layer; and a planarization layer covering the storage electrode and the data layer, wherein the data layer includes a driving voltage line, a first driving low-voltage line, and a second driving low-voltage line, and the first driving low-voltage line overlaps and is directly connected to the low-voltage gate connector.

18. The organic light emitting diode display of claim 17, further comprising:

an anode electrode disposed on the planarization layer;

an organic light emitting layer disposed on the anode electrode; and a cathode electrode disposed on the organic light emitting layer.

19. The organic light emitting diode display of claim 18, further comprising:

an opening is defined through the planarization layer to overlap the first driving low-voltage line.

20. The organic light emitting diode display of claim 19, wherein the first driving low-voltage line is electrically connected to the cathode electrode through the opening.

* * * * *